United States Patent
Chen et al.

(10) Patent No.: US 9,635,757 B1
(45) Date of Patent: Apr. 25, 2017

(54) CIRCUIT BOARD AND MANUFACTURING METHOD THEREOF

(71) Applicant: Unimicron Technology Corp., Taoyuan (TW)

(72) Inventors: Yin-Ju Chen, Chiayi County (TW); Chi-Min Chang, Taoyuan (TW); Cheng-Po Yu, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 15/233,972

(22) Filed: Aug. 11, 2016

(51) Int. Cl.
*H05K 1/03* (2006.01)
*H05K 3/00* (2006.01)

(52) U.S. Cl.
CPC ......... *H05K 1/0366* (2013.01); *H05K 3/0023* (2013.01); *H05K 2203/1105* (2013.01)

(58) Field of Classification Search
CPC .. H05K 1/0366; H05K 1/0353; H05K 1/0373; H05K 1/036; H05K 1/038; H05K 1/0386; H05K 3/4688; H05K 3/4694; H05K 3/0023
See application file for complete search history.

(56) References Cited

FOREIGN PATENT DOCUMENTS

| CN | 201797649 | 4/2011 |
|----|-----------|--------|
| CN | 103237422 | 8/2013 |
| CN | 105163525 | 12/2015 |

*Primary Examiner* — Jeremy C Norris
(74) *Attorney, Agent, or Firm* — Jianq Chyun IP Office

(57) ABSTRACT

A circuit board and a manufacturing method thereof are provided. The circuit board includes a dielectric substrate, a circuit pattern and a dielectric layer. The circuit pattern is disposed on the dielectric substrate. The dielectric layer is disposed on the dielectric substrate and covers the circuit pattern. The dielectric layer includes a dielectric matrix and a mesh-shaped fiber structure disposed in the dielectric matrix. There is no mesh-shaped fiber structure on a portion of the dielectric substrate exposed by the circuit pattern.

9 Claims, 5 Drawing Sheets

CIRCUIT BOARD AND MANUFACTURING METHOD THEREOF

BACKGROUND OF THE INVENTION

1. Field of the Invention

The invention relates to a circuit board and a manufacturing method thereof, and particularly relates to a circuit board where there is no mesh-shaped fiber structure in a dielectric layer on a portion of a dielectric substrate exposed by a circuit pattern and a manufacturing method thereof.

2. Description of Related Art

Generally speaking, a manufacturing process of a circuit board includes steps such as forming a circuit pattern on a substrate, forming a dielectric layer covering the circuit pattern, forming a conductive via in the dielectric layer, and forming another layer of circuit pattern on the dielectric layer, etc. The dielectric layer is usually formed of a resin matrix and a mesh-shaped glass fiber structure in the resin matrix. In the step of forming the dielectric layer covering the circuit pattern, the dielectric layer is usually disposed on the substrate where the circuit pattern is already formed, and a thermal compressing process is performed so that the resin matrix in the dielectric layer is melted to cover the circuit pattern.

However, when the circuit pattern in the circuit board requires a greater thickness (e.g., when the circuit board is applied in a device for vehicles), it is usually challenging to completely fill a region on a portion of the dielectric substrate exposed by the circuit pattern with the melted resin matrix during the thermal compressing process. Alternatively, during the thermal compressing process, it may be challenging to fill the region because the resin matrix in the melted state may be affected by the mesh-shaped glass fiber structure. Thus, there may be pores in the circuit board being formed, so the reliability of the circuit board may be reduced.

SUMMARY OF THE INVENTION

The invention provides a circuit board having a higher reliability.

The invention provides a manufacturing method of a circuit board capable of manufacturing a circuit board with a higher reliability.

The circuit board according to an embodiment of the invention includes a dielectric substrate, a circuit pattern, and a dielectric layer. The circuit pattern is disposed on the dielectric substrate. The dielectric layer is disposed on the dielectric substrate and covers the circuit pattern. The dielectric layer includes a dielectric matrix and a mesh-shaped fiber structure disposed in the dielectric matrix. There is no mesh-shaped fiber structure on a portion of the dielectric substrate exposed by the circuit pattern.

According to an embodiment of the circuit board of the invention, a material of the mesh-shaped fiber structure includes a photosensitive polymer, for example.

According to an embodiment of the circuit board of the invention, a glass transition temperature of the mesh-shaped fiber structure is higher than a glass transition temperature of the dielectric matrix, for example.

According to an embodiment of the circuit board of the invention, a thickness of the circuit pattern is greater than 50 µm, for example.

A manufacturing method of a circuit board according to an embodiment of the invention includes steps as follows: providing a dielectric substrate, wherein a circuit pattern is formed on the dielectric substrate; providing a dielectric layer including a dielectric matrix and a photosensitive mesh-shaped fiber formed in the dielectric matrix; disposing the dielectric layer on the dielectric substrate; providing a selective exposing process to the dielectric layer, such that an irradiated portion of the photosensitive mesh-shaped fiber has a glass transition temperature higher than a glass transition temperature of a non-irradiated portion, wherein a position of the irradiated portion corresponds to a position of the circuit pattern, and the glass transition temperature of the irradiated portion is higher than a glass transition temperature of the dielectric matrix; performing a thermal compressing process to the dielectric layer, wherein a temperature of the thermal compressing process is higher than the glass transition temperature of the dielectric matrix and the glass transition temperature of the non-irradiated portion of the photosensitive mesh-shaped fiber but lower than the glass transition temperature of the irradiated portion of the photosensitive mesh-shaped fiber, such that the dielectric matrix and the non-irradiated portion are melted to be filled into a region on a portion of the dielectric substrate exposed by the circuit pattern; and performing a curing process to the dielectric layer that undergoes the thermal compressing process.

According to an embodiment of the manufacturing method of the circuit board of the invention, the selective exposing process is performed to the dielectric layer after disposing the dielectric layer on the dielectric substrate.

According to an embodiment of the manufacturing method of the circuit board of the invention, the dielectric layer is disposed on the dielectric substrate after performing the selective exposing process to the dielectric layer.

According to an embodiment of the manufacturing method of the circuit board of the invention, a material of the photosensitive meshed fiber includes a photosensitive polymer, for example.

According to an embodiment of the manufacturing method of the circuit board of the invention, a thickness of the circuit pattern is greater than 50 µm, for example.

Based on the above, in the embodiments of the invention, the mesh-shaped fiber in the dielectric layer is formed of a photosensitive material, and the selective exposing process is performed to the dielectric layer before the dielectric layer is thermally compressed to the dielectric substrate, such that the glass transition temperature of a portion of the mesh-shaped fiber may be increased through light irradiation, and the portion is arranged to correspond to the position of the circuit pattern on the dielectric substrate. Thus, during the thermal compression process, the portion of the mesh-shaped fiber having a higher glass transition temperature is not melted, and a portion of the mesh-shaped fiber remaining at the original glass transition temperature is melted to completely fills the region on the portion of the dielectric substrate exposed by the circuit pattern together with the melted dielectric matrix. Accordingly, formation of pores may be avoided, and the reliability of the circuit board may be increased.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
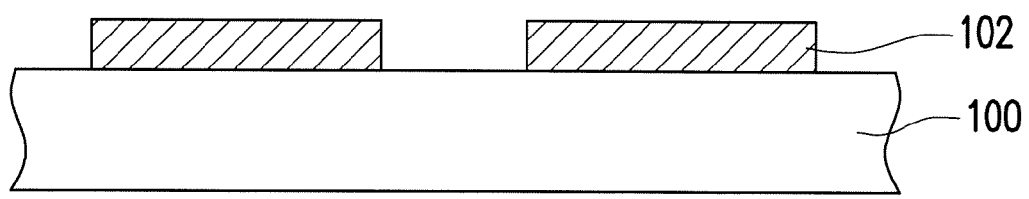
FIGS. 1A to 1D are schematic cross-sectional view illustrating a manufacturing process of a circuit board according to a first embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In this embodiment, a circuit board with one layer of circuit pattern is described for an illustrative purpose. However, it should be noted that the invention is not limited thereto. Based on practical needs, a circuit board with more layers of circuit pattern may be formed in the same manner.

First Embodiment

FIGS. 1A to 1D are schematic cross-sectional view illustrating a manufacturing process of a circuit board according to a first embodiment of the invention. First of all, referring to FIG. 1A, a circuit pattern 102 is formed on a dielectric substrate 100. The circuit pattern 102 exposes a portion of the dielectric substrate 100. A process of forming the circuit pattern 102 includes, for example, forming a conductive material layer on the dielectric substrate 100 by compression and patterning the conductive material layer. A material of the dielectric substrate 100 includes epoxy resin, glass fiber cloth, or ceramics. In this embodiment, a thickness of the circuit pattern 102 is greater than 50 μm. When the thickness of the circuit pattern 102 is greater than 50 μm, the circuit board formed accordingly is suitable for a device for vehicles requiring a higher current. However, it should be noted that the invention is not limited thereto.

Figure 1B:
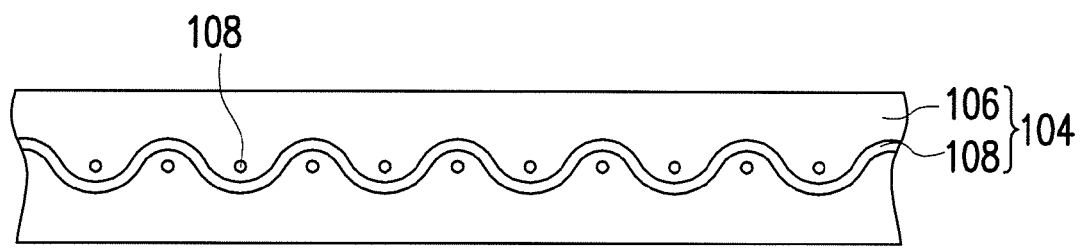
Figure 2:
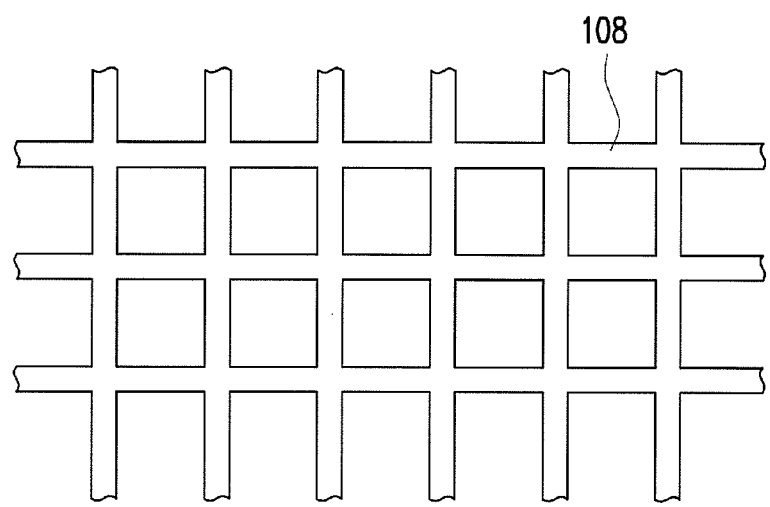
FIG. 2 is a schematic top view illustrating a photosensitive mesh-shaped fiber in FIG. 1B.

Then, referring to FIG. 1B, a dielectric layer 104 is provided. The dielectric layer 104 includes a dielectric matrix 106 and a photosensitive mesh-shaped fiber 108 formed in the dielectric matrix 106. A material of the dielectric matrix 106 includes polypropylene (PP), for example. A material of the photosensitive mesh-shaped fiber 108 includes a photosensitive polymer, for example, such as poly(methyl methacrylate) (PMMA). The photosensitive mesh-shaped fiber 108 is formed by performing an injection-molding process, for example, and a structure of the photosensitive mesh-shaped fiber 108 is shown in FIG. 2. In this embodiment, the photosensitive mesh-shaped fiber 108 has a characteristic that a glass transition temperature (Tg) thereof increases after being irradiated by light (e.g., ultraviolet light). A process of forming the dielectric layer 104 includes immersing the photosensitive mesh-shaped fiber 108 into the dielectric matrix 106 that is melted after being heated, and then performing a curing process by lowering the temperature. In this embodiment, the dielectric layer 104 has a layer of the photosensitive mesh-shaped fiber 108. However, it should be noted that the invention is not limited thereto. In other embodiments, based on practical requirements, the dielectric layer 104 may have more layers of the photosensitive mesh-shaped fiber 108.

Figure 1C:
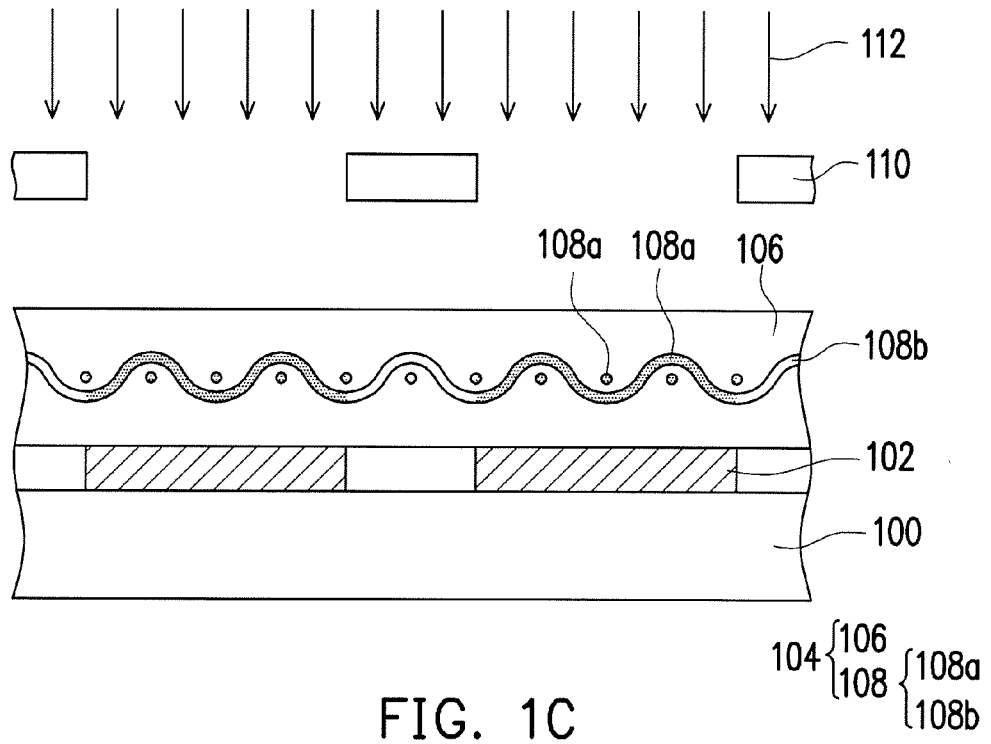

Then, referring to FIG. 1C, the dielectric layer 104 is disposed on the dielectric substrate 100. Then, by using a photomask 110, a selective exposing process is performed to the dielectric layer 104. The photomask 110 has an opening corresponding to a position of the circuit pattern 102. In other words, when the exposing process is performed with a light beam 112 (e.g., ultraviolet light), it may be arranged such that the light beam 112 that irradiates in a direction perpendicular to the photomask 110 only irradiates the dielectric layer 104 right on the circuit pattern 102. When the light beam 112 irradiates the dielectric layer 104, a portion 108a of the photosensitive mesh-shaped fiber 108 irradiated by the light beam 112 reacts, leading to the glass transition temperature to increase, and a portion 108b that is not irradiated by the light beam 112 remains at the original glass transition temperature. In this embodiment, after the selective exposing process, the glass transition temperature of the portion 108a irradiated by the light beam 112 increases due to a material characteristic that the glass transition temperature thereof increases as a molecular weight increases. Consequently, the glass transition temperature of the portion 108a is higher than the glass transition temperature of the portion 108b without irradiation of the light beam 112 and a glass transition temperature of the dielectric matrix 106.

Figure 1D:
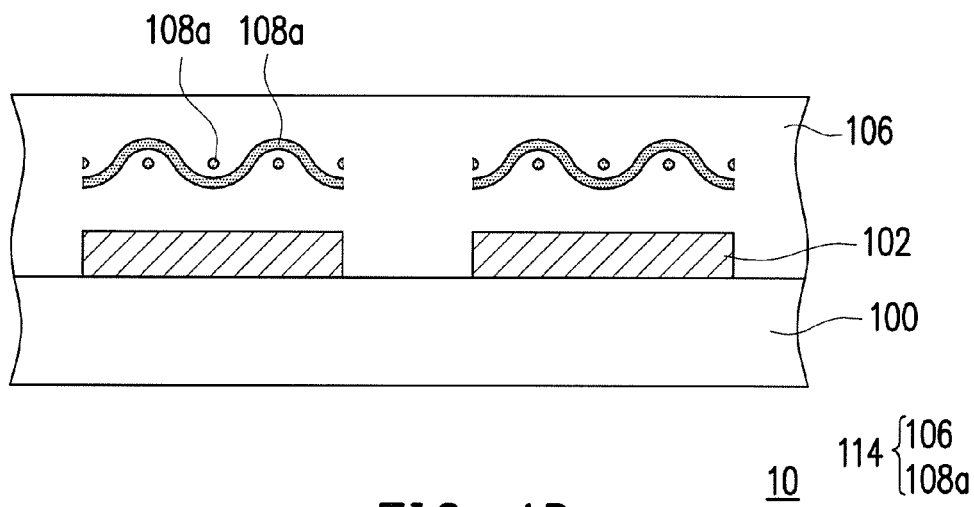

Then, referring to FIG. 1D, a thermal compressing process is performed to the dielectric layer 104. The glass transition temperature of the portion 108a irradiated by the light beam 112 is higher than the glass transition temperature of the portion 108b without irradiation of the light beam 112 and the glass transition temperature of the dielectric matrix 106, so a temperature in the thermal compressing process is controlled to be higher than the glass transition temperature of the portion 108b without irradiation of the light beam 112 and the glass transition temperature of the dielectric matrix 106 and lower than the glass transition temperature of the portion 108a irradiated by the light beam 112, such that the portion 108b without irradiation of the light beam 112 and the dielectric matrix 106 are melted and filled into a region on the portion of the dielectric substrate 110 exposed by the circuit pattern 102. In this way, even though the circuit pattern has a greater thickness, the melted dielectric matrix 106 may still completely fill the region. In addition, during the thermal compressing process, the portion 108b of the photosensitive mesh-shaped fiber 108 on the portion of the dielectric substrate 100 exposed by the circuit pattern 102 is also melted and fills the region together with the melted dielectric matrix 106. Therefore, the melted dielectric matrix 106 may completely fill the region without being blocked by the photosensitive mesh-shaped fiber 108. In addition, since the glass transition temperature of the portion 108a irradiated by the light beam 112 is higher than the temperature in the thermal compressing process, the portion 108a may not be melted by the heat and may remain at the original position.

Then, a curing process is performed to the dielectric layer 104 that undergoes the thermal compressing process, so as to form a dielectric layer 114. In this way, the manufacture of the circuit board 10 of this embodiment is completed. The curing process is performed by, for example, lowering the temperature. The dielectric layer 114 formed accordingly includes a mesh-shaped fiber structure and the dielectric matrix 106, and the dielectric matrix 106 completely covers the dielectric substrate 100 and the circuit pattern 102 without presence of pores. Thus, the circuit board 10 may have a higher reliability. It should be noted that, since the portion 108b of the photosensitive mesh-shaped fiber 108 is also melted due to a high temperature during the thermal compressing process, there is no photosensitive mesh-shaped fiber 108 on the portion of the dielectric substrate 100 exposed by the circuit pattern 102 in the circuit board 10 (the photosensitive mesh-shaped fiber 108 is only present on the circuit pattern 102). In other words, the mesh-shaped fiber structure of the dielectric layer 114 is completely formed by the portion 108b of the photosensitive mesh-shaped fiber 108.

It should be noted that, in this embodiment, the dielectric layer 104 is disposed on the dielectric substrate 100, and then the selective exposing process is performed to the dielectric layer 104. However, the invention is not limited thereto. In another embodiment, the order of the processes may be switched, as described in the following.

Second Embodiment

Figure 3A:
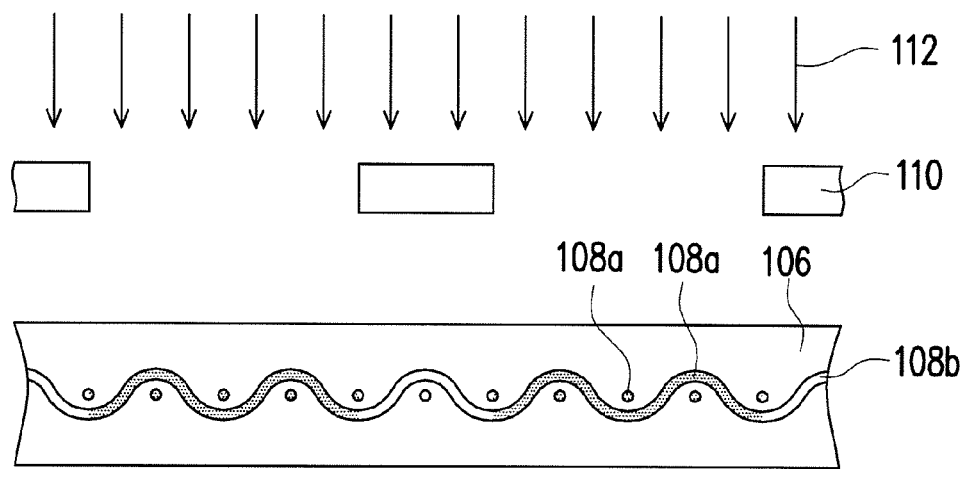
FIGS. 3A to 3C are schematic cross-sectional view illustrating a manufacturing process of a circuit board according to a second embodiment of the invention.
Figure 3B:
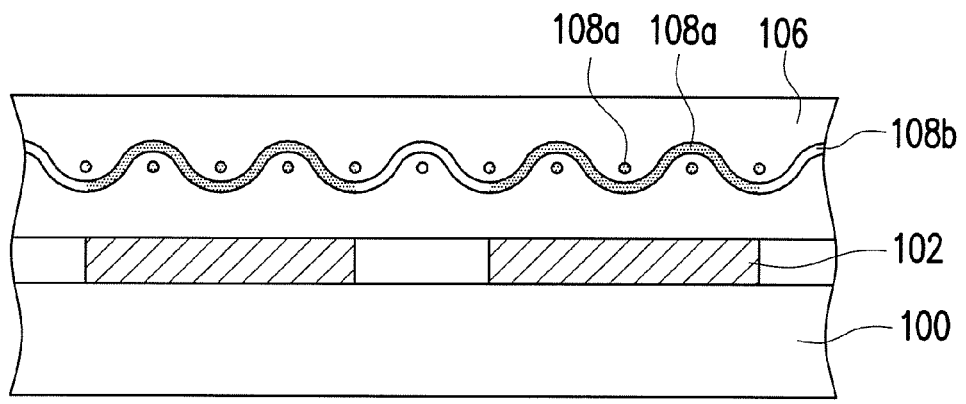
Figure 3C:
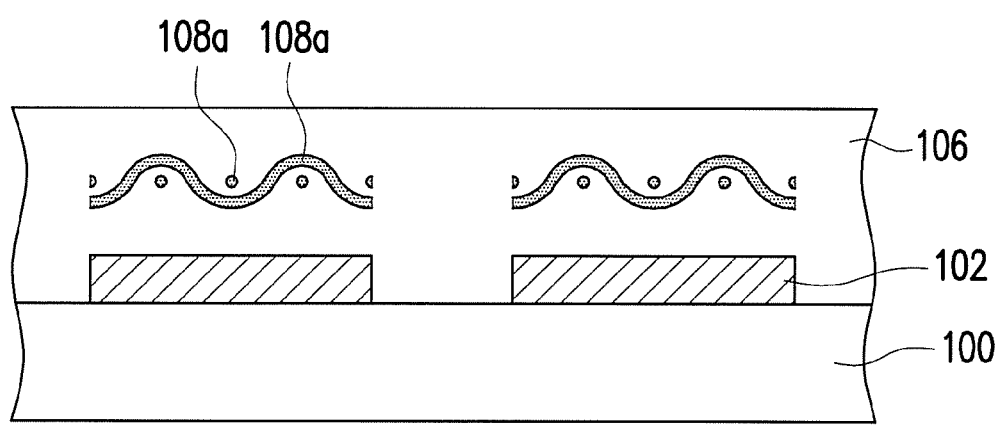

FIGS. 3A to 3C are schematic cross-sectional view illustrating a manufacturing process of a circuit board according to a second embodiment of the invention. In this embodiment, components and steps identical to those of the first embodiment will not be further reiterated. First of all, referring to FIG. 3A, before disposing the dielectric layer 104 on the dielectric substrate 100, the selective exposing process is performed to the dielectric layer 104 by using the photomask 110. When the light beam 112 passes through the photomask 110 and irradiates the dielectric layer 104, the portion 108a having a higher glass transition temperature and the portion 108b remaining at the original glass transition temperature are formed in the photosensitive mesh-shaped fiber 108, as illustrated in FIG. 1C. Since the photomask 100 has the opening corresponding to the position of the circuit pattern 102, the portion 108a having the higher glass transition temperature formed herein may correspond to the position of the circuit pattern 102 in a subsequent process.

Then, referring to FIG. 3B, the dielectric layer 104 is disposed on the dielectric substrate 100, such that the portion 108a having a higher glass transition temperature of the photosensitive mesh-shaped fiber 108 may be aligned with the circuit pattern 102. In this embodiment, alignment holes (not shown) respectively located in the dielectric layer 104 and the dielectric substrate 100, for example, are provided for alignment.

Then, referring to FIG. 3C, the thermal compressing process is performed to the dielectric layer 104, and the curing process is performed to the dielectric layer 104 that undergoes the thermal compressing process, as illustrated in FIG. 1D, so as to complete the manufacture of the circuit board 10.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board, comprising:
a dielectric substrate;
a circuit pattern disposed on the dielectric substrate; and
a dielectric layer, disposed on the dielectric substrate, covering the circuit pattern, and comprising a dielectric matrix and a mesh-shaped fiber structure disposed in the dielectric matrix, wherein there is no mesh-shaped fiber structure on a portion of the dielectric substrate exposed by the circuit pattern.

2. The circuit board as claimed in claim 1, wherein a material of the mesh-shaped fiber structure comprises a photosensitive polymer.

3. The circuit board as claimed in claim 1, wherein a glass transition temperature of the mesh-shaped fiber structure is higher than a glass transition temperature of the dielectric matrix.

4. The circuit board as claimed in claim 1, wherein a thickness of the circuit pattern is greater than 50 μm.

5. A method of manufacturing a circuit board, comprising:
providing a dielectric substrate, wherein a circuit pattern is formed on the dielectric substrate;
providing a dielectric layer, comprising a dielectric matrix and a photosensitive mesh-shaped fiber formed in the dielectric matrix;
disposing the dielectric layer on the dielectric substrate;
providing a selective exposing process to the dielectric layer, such that an irradiated portion of the photosensitive mesh-shaped fiber has a glass transition temperature higher than a glass transition temperature of a non-irradiated portion, wherein a position of the irradiated portion corresponds to a position of the circuit pattern, and the glass transition temperature of the irradiated portion is higher than a glass transition temperature of the dielectric matrix;
performing a thermal compressing process to the dielectric layer, wherein a temperature of the thermal compressing process is higher than the glass transition temperature of the dielectric matrix and the glass transition temperature of the non-irradiated portion of the photosensitive mesh-shaped fiber but lower than the glass transition temperature of the irradiated portion of the photosensitive mesh-shaped fiber, such that the dielectric matrix and the non-irradiated portion are melted to be filled into a region on a portion of the dielectric substrate exposed by the circuit pattern; and
performing a curing process to the dielectric layer that undergoes the thermal compressing process.

6. The manufacturing method of the circuit board as claimed in claim 5, wherein the selective exposing process is performed to the dielectric layer after disposing the dielectric layer on the dielectric substrate.

7. The manufacturing method of the circuit board as claimed in claim 5, wherein the dielectric layer is disposed on the dielectric substrate after performing the selective exposing process to the dielectric layer.

8. The manufacturing method of the circuit board as claimed in claim 5, wherein a material of the photosensitive meshed fiber comprises a photosensitive polymer.

9. The manufacturing method of the circuit board as claimed in claim 5, wherein a thickness of the circuit pattern is greater than 50 μm.

* * * * *